US011630993B2

(12) United States Patent
Rummens et al.

(10) Patent No.: US 11,630,993 B2
(45) Date of Patent: Apr. 18, 2023

(54) ARTIFICIAL NEURON FOR NEUROMORPHIC CHIP WITH RESISTIVE SYNAPSES

(71) Applicant: COMMISSARIAT À L'ÉNERGIE ATOMIQUE ET AUX ÉNERGIES ALTERNATIVES, Paris (FR)

(72) Inventors: François Rummens, Grenoble (FR); Alexandre Valentian, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 547 days.

(21) Appl. No.: 16/703,465

(22) Filed: Dec. 4, 2019

(65) Prior Publication Data

US 2020/0202206 A1 Jun. 25, 2020

(30) Foreign Application Priority Data

Dec. 7, 2018 (FR) ....................................... 1872515

(51) Int. Cl.
*G11C 11/34* (2006.01)
*G06N 3/065* (2023.01)
(Continued)

(52) U.S. Cl.
CPC .............. *G06N 3/065* (2023.01); *G11C 11/34* (2013.01); *G11C 11/54* (2013.01); *G11C 13/0002* (2013.01); *G11C 13/004* (2013.01)

(58) Field of Classification Search
CPC ...... G06N 3/0635; G06N 3/049; G11C 11/34; G11C 11/54; G11C 13/0002; G11C 13/004
See application file for complete search history.

(56) References Cited

U.S. PATENT DOCUMENTS

2012/0011092 A1* 1/2012 Tang ...................... G06N 3/063 706/33
2017/0243108 A1 8/2017 Ritter et al.
(Continued)

FOREIGN PATENT DOCUMENTS

WO 2018201060 A1 11/2018

OTHER PUBLICATIONS

Krestinskaya, Olga et al. Neuro-memristive Circuits for Edge Computing: A Review, IN: IEEE, Nov. 28, 2018, pp. 1-20.
(Continued)

*Primary Examiner* — Mohammed A Bashar
(74) *Attorney, Agent, or Firm* — Pearne & Gordon LLP

(57) ABSTRACT

An artificial neuron for a neuromorphic chip comprises a synapse with resistive memory representative of a synaptic weight. The artificial neuron comprises a read circuit, an integration circuit and a logic circuit interposed between the read circuit and the integration circuit. The read circuit is configured to impose on the synapse a read voltage independent of the membrane voltage and to provide an analogue value representative of the synaptic weight. The logic circuit is configured to generate from the analogue value a pulse having a duration. The integration circuit comprises an accumulator of synaptic weights at the terminals of which a membrane voltage is established and a comparator configured to emit a postsynaptic pulse if a threshold is exceeded by the membrane voltage. Moreover, it comprises a source of current controlled by the pulse to inject a current into the accumulator of synaptic weights during this duration.

7 Claims, 12 Drawing Sheets

(51) Int. Cl.
*G11C 11/54* (2006.01)
*G11C 13/00* (2006.01)

(56) References Cited

U.S. PATENT DOCUMENTS

| | | | | |
|---|---|---|---|---|
| 2018/0260696 | A1* | 9/2018 | Suda | G06N 3/049 |
| 2020/0117982 | A1* | 4/2020 | Chiu | G06N 3/08 |

OTHER PUBLICATIONS

Search Report for French Application No. 1872515 dated Aug. 26, 2019.
Schaik, A. van, :Building blocks for electronic spiking neural networks: IN Neural Networks, 2001, vol. 14, pp. 617-628.
Laiho, Mika et al. "Memrisitive synapses are becoming reality" IN: The Neuromorphic Engineer, Jan. 2010, pp. 1-2.
U.S. Appl. No. 16/508,563 titled "Spiking Neuromorphic Circuit Implementing a Formal Neuron" filed Jul. 11, 2019.

* cited by examiner

ARTIFICIAL NEURON FOR NEUROMORPHIC CHIP WITH RESISTIVE SYNAPSES

TECHNICAL FIELD

The field of the invention is that of neuromorphic chips with networks of artificial neurons using synapses with resistive memory.

PRIOR ART

A nerve cell, or neuron, can be decomposed into several parts:

The dendrites which are the inputs of the neuron through which it receives excitation or inhibition signals;

The body of the neuron which is the location of ionic exchanges through the cell membrane;

The axon, a long extension of the cell body, which is the only output of the body.

According to the excitation or inhibition signals received at the dendrites, ions transit through the cell membrane. The imbalance of charges between the inside and the outside of the cell induces a voltage difference on either side of the membrane. This is called membrane voltage at the terminals of a membrane capacitance. When this membrane voltage exceeds a certain level, that is to say when the cell is sufficiently excited, the neuron experiences an abrupt exchange of ions. This results in a significant variation in the membrane voltage. This variation, called action potential ("action potential" or "spike" in English), propagates along the axon, towards the synaptic buttons that form the outputs of the neuron. Viewed from the outside of the cell, these "spikes" form the electric activity of the neuron.

In a network of biological neurons, each neuron is connected to several thousand others via as many synapses. The term synapse designates the connection between the axon terminal of a neuron called presynaptic and a dendrite of a neuron called postsynaptic. The influence of the presynaptic neuron on the postsynaptic neuron is weighted by the weight of the synapse which can be excitatory or inhibitory. In the first case, a presynaptic "spike" charges the membrane voltage of the postsynaptic neuron and precipitates the generation of a postsynaptic action potential. In the second case, a presynaptic "spike" has the effect of depolarising the postsynaptic membrane and delaying the appearance of a postsynaptic action potential.

Networks of artificial neurons are used in various fields of signal processing for example such as data classification, image recognition or decision making. They are inspired by the networks of biological neurons, the operation of which they imitate, and are substantially composed of artificial neurons interconnected with each other by synapses which can be implemented by resistive components, the conductance of which varies according to the voltage applied at their terminals.

Due to their high density and their non-volatile nature, these resistive components (memristors or RRAM) are ideal candidates for the implementation of the synapses. The variable resistance of these components can be increased (operation called Reset) or reduced (Set operation) if relatively high electric values (voltage and/or current) are applied thereto. If it is desired to simply read the value of their resistance without modifying it (Read operation), relatively low electric values must be applied.

The integration of resistive synapses often takes the form of a memory array, which is called "synaptic array", in which the synapses are arranged into a network with transverse lines and columns which allows to connect a layer of input neurons (the presynaptic neurons) and a layer of output neurons (the postsynaptic neurons). Each synapse has a terminal for activation of the synapse and a terminal for propagation of a synaptic signal. The activation terminals of the synapses of the same line are connected to each other via a word line (or "Word-Line") and the propagation terminals of the synapses of the same column are connected to each other and connected to an artificial neuron via a bit line (or "Bit-Line"). A word line is used to inject a voltage impulse into the synapses of the corresponding line and the bit lines are the outputs of these synapses. In the presence of a presynaptic activation on a word line from a presynaptic neuron, each bit line propagates a current weighted by the value of the corresponding resistive memory towards a postsynaptic neuron.

As shown in FIG. 1 (hereinafter figure x designates the appended drawing Fig. x), a synapse with resistive memory generally takes the form of a 1T1R cell composed of a variable resistance M and of an access transistor T used to regulate the write currents and the gate of which forms the activation terminal of the synapse. FIG. 1 shows an example of a synaptic array with 1T1R cells comprising three word lines WL1-WL3, eight bit lines BL1-BL8 each intended to be connected to an output neuron and a source line (or "Source-Line") SL connected to all the synapses. However, the presence of a transistor per synapse limits the density of such a synaptic array.

As shown in FIG. 2, 1S1R cells composed of a variable resistance M and of a selector S having a behaviour similar to a diode, or even to two diodes back to back, can alternatively be used. Each 1S1R cell is a dipole, the terminals of which form the activation and propagation terminals, and the synaptic array is organised as shown in FIG. 2 in which the example of an array comprising three word lines WL1-WL3 and four bit lines BL1-BL4 has been taken, and in which each synapse is taken between a voltage on the corresponding word line and a voltage on its corresponding bit line.

A certain number of constraints weigh on the effective implementation of such a network of artificial neurons.

For example, while the organisation of the synaptic array has advantages (parallelisation of the calculations, density, sharing of the drivers), it has limitations. First of all, this organisation offers an all-to-all connection according to which all the presynaptic neurons are connected via a synapse to all the postsynaptic neurons. However, in certain cases, this "all-to-all" connection can lead to a principally null synaptic matrix and thus to a low energy efficiency. This organisation also requires having to finely process the zero weights or risk having a network composed mainly of parasitic synapses, making the analogue integration of the synaptic weights even more complex.

Another constraint is related to the conventional implantation of an artificial neuron in the form of an integrate-and-fire neuron. The principle of such an implementation is shown in FIG. 3. The contribution $V_{spike\_pre}$ of a presynaptic neuron is weighted by the value of the corresponding synaptic resistance $R_{synb}$ and thus provides an excitation current $I_{synb}$. This current is injected into a capacitance $C_{mem}$ which integrates the various stimulations over time. The membrane voltage, modelled by the voltage $V_{mem}$ at the terminals of the capacitance $C_{mem}$, is compared to a threshold $V_{seuil}$. When this threshold is exceeded by the membrane voltage, a spike $V_{spike}$ is emitted and the capacitance $C_{mem}$ is discharged to reinitialise the membrane voltage, typically by resetting it to zero.

However, according to Ohm's law, and as shown in FIG. 4, the current $I_{synb}$ which should only depend on the value of the resistance $R_{synb}$ of the synapse depends in reality on the value of the membrane voltage $V_{mem}$:

$$I_{synb} = \frac{V_{spike\text{-}pre} - V_{mem}}{R_{synb}}.$$

This means that the higher the voltage $V_{mem}$, therefore the more the neuron is excited and liable to emit a spike, the less the relevant synapses have an effect on it. Such a phenomenon is problematic. Thus, in a classification layer for example, the activity of the neuron that is supposed to emit the most spikes is reduced in a greater proportion than that of the less active neurons. Therefore, the difference between this "winning" neuron and the other neurons is reduced.

Other constraints are related to the characteristics of the RRAM memories. An example of such an RRAM memory is the OxRAM memory which is composed of an insulant wedged between two layers of conductors. During a first formation step, a conductive wire grows from one of the conductors towards the other, thus reducing the total resistance of the dipole. Once this wire has been formed, the actions of writing act on the length to vary the resistance. A Set operation elongates the wire and reduces the resistance while a Reset operation has the inverse effect. The reading of an OxRAM presents a difficulty, that of parasitic writing by modifying little by little the value of the resistance over successive readings. To limit this risk, it is advised to apply a maximum reading voltage of 100 mV. The smallness of this voltage greatly complicates the implementation of integrative analogue reading of these memories. Indeed, the reading voltage $V_{spike\_pre}$ limits the membrane voltage $V_{mem}$, since the membrane capacitance $C_{mem}$ is charged through the resistance $R_{synb}$ onto which $V_{spike\_pre}$ is applied. In other words, the membrane voltage is equal at most to the voltage $V_{spike\_pre}$. However, since $V_{mem}$ is an analogue calculation element and thus subjected in particular to issues of noise, technological variations, capacitive coupling, its voltage range cannot be reduced to a value as low as 100 mV without greatly increasing the sources of calculation errors.

Moreover, it is noted that RRAM devices often have a low range of resistance (with low values of approximately one kΩ) and that time constants of the pair $R_{syn}$-$C_{mem}$ of approximately one nanosecond or even less may be encountered. However, it is not easy to generate read pulses of less than Ins, unless a specific circuit is used. The read pulse must further be propagated over the entire width of the synaptic array. However, the shorter this pulse, the less it is "clean" at the end of the line. Finally, such a pulse has difficulty propagating in active analogue circuits tasked with integrating the read current without being faced with issues of bandwidth and/or distortion.

DISCLOSURE OF THE INVENTION

The goal of the invention is to provide a solution allowing to meet one and/or the other of the aforementioned constraints. To do this it proposes an artificial neuron for a neuromorphic chip comprising a synapse with resistive memory representative of a synaptic weight, the artificial neuron including an integration circuit that comprises an accumulator of synaptic weights at the terminals of which a membrane voltage is established and a comparator configured to emit a postsynaptic pulse if a threshold is exceeded by the membrane voltage.

The neuron further includes:

- a read circuit configured to impose on the synapse a read voltage independent of the membrane voltage and to provide an analogue value representative of the synaptic weight, said analogue value being a duration; and
- a logic circuit interposed between the read circuit and the integration circuit, the logic circuit being configured to generate from said analogue value a pulse having said duration.

The integration circuit comprises a source of current controlled by said pulse to inject a current into the accumulator of synaptic weights during said duration.

Certain preferred but non-limiting aspects of this artificial neuron are the following:

- the read circuit comprises an accumulator of synaptic current, at least one comparator of the voltage at the terminals of the accumulator of synaptic current to a threshold to provide a comparison result and the logic circuit is configured to generate said pulse from the result of the comparison;
- the at least one comparator of the read circuit comprises a first comparator to a first threshold and a second comparator to a second threshold and the logic circuit is configured to determine an integration sign by using a signal representative of a sign of presynaptic pulse and a piece of information on sign of synaptic weight determined by that of the first and second comparators that switches;
- the at least one comparator of the read circuit comprises a first comparator to a first threshold and a second comparator to a second threshold and the logic circuit is configured in such a way that the duration of said pulse corresponds to a duration separating the exceeding of one of the thresholds and then the exceeding of the other of the thresholds;
- the synapse comprising a memory of absolute value of synaptic weight and a memory of sign of synaptic weight, the read circuit comprises a circuit for binary reading of the memory of sign of synaptic weight and a circuit for analogue reading of the memory of absolute value of synaptic weight controlled by the circuit for binary reading.

BRIEF DESCRIPTION OF THE DRAWINGS

Other aspects, goals, advantages and features of the invention will be clearer upon reading the following detailed description of preferred embodiments of the latter, given as a non-limiting example, and made in reference to the following drawings above.

DETAILED DESCRIPTION

Figure 1:
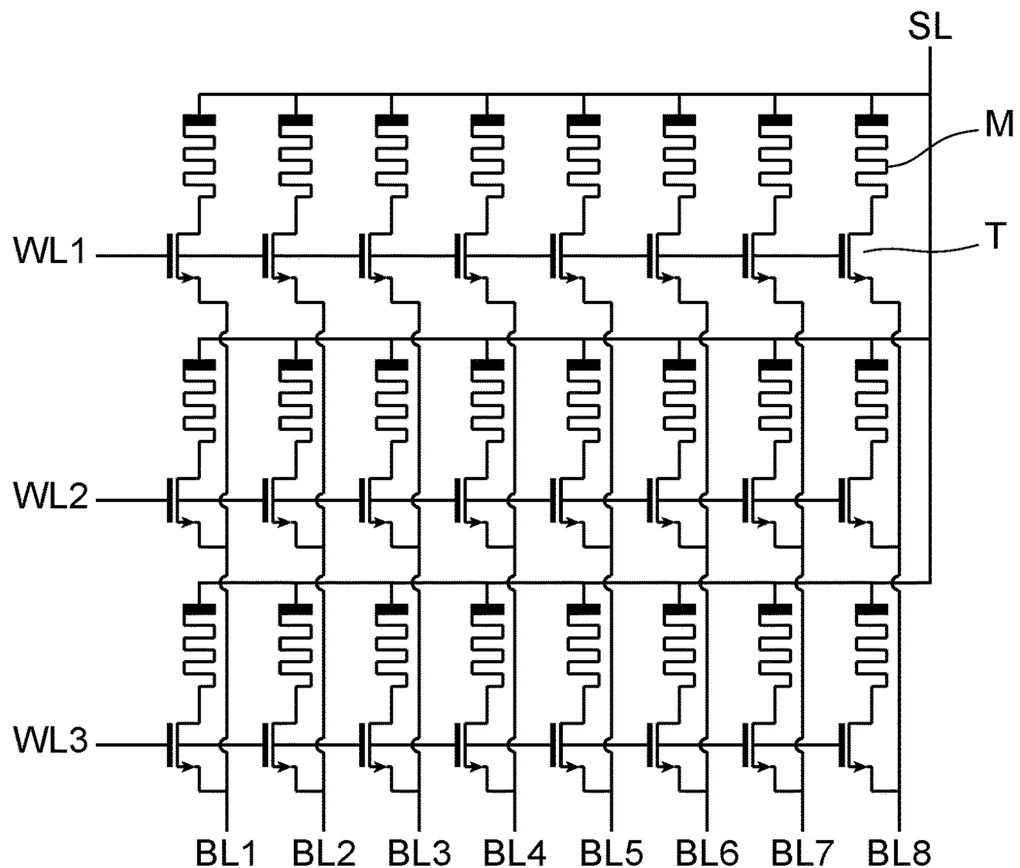
FIG. 1 discussed above shows a known synaptic array, formed of 1T1R cells.
Figure 2:
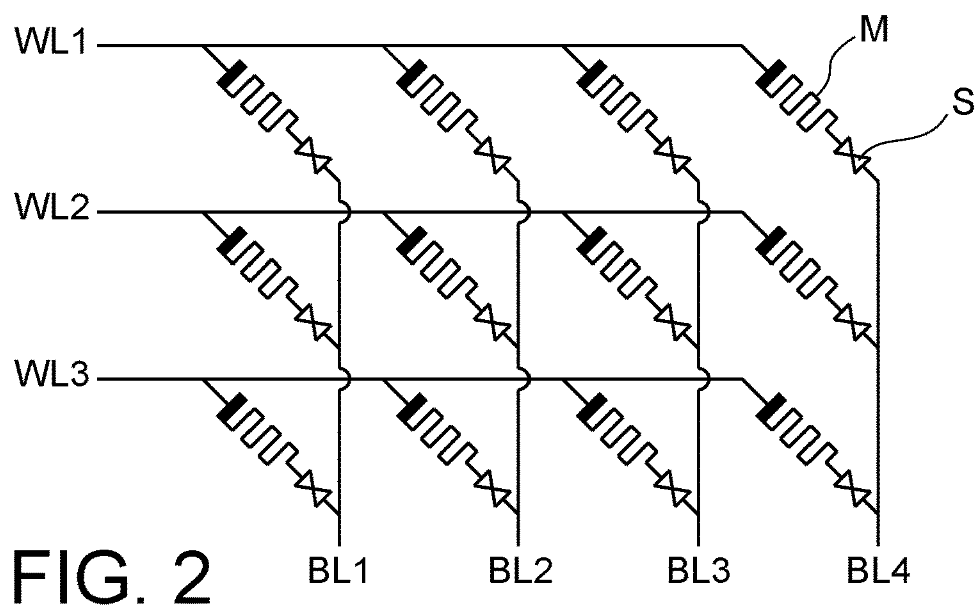
FIG. 2 discussed above shows a known synaptic array, formed of 1S1R cells.
Figure 3:
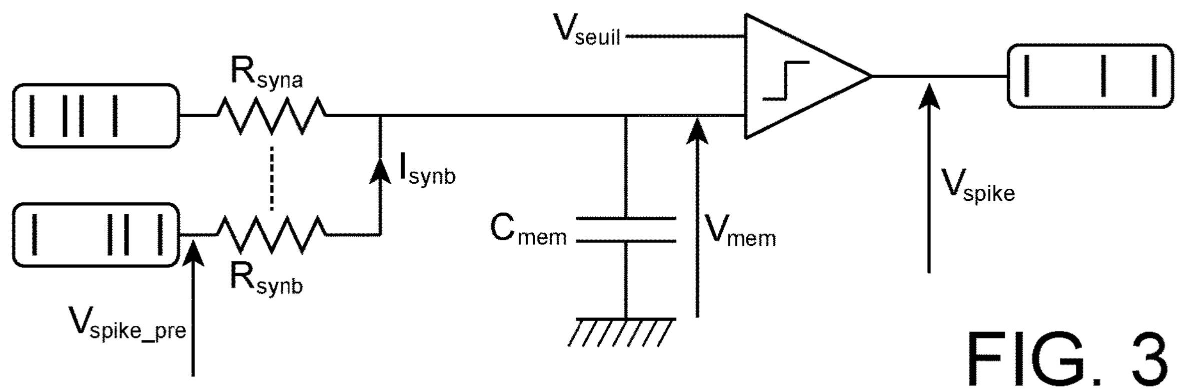
FIG. 3 discussed above is a schematic drawing which illustrates a known implementation of an artificial neuron in the form of an integrate-and-fire neuron.
Figure 4:
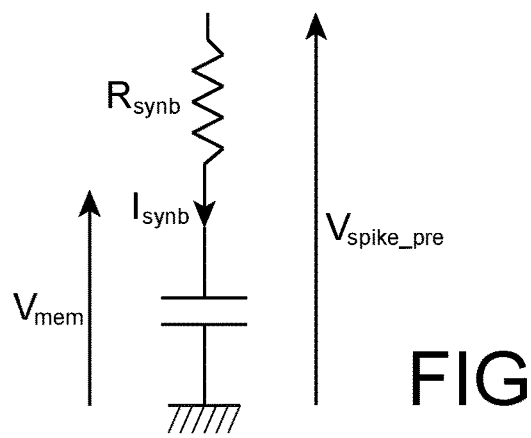
FIG. 4 discussed above is a schematic drawing which shows how the voltage across a presynaptic neuron and the membrane voltage are defined.
Figure 5:
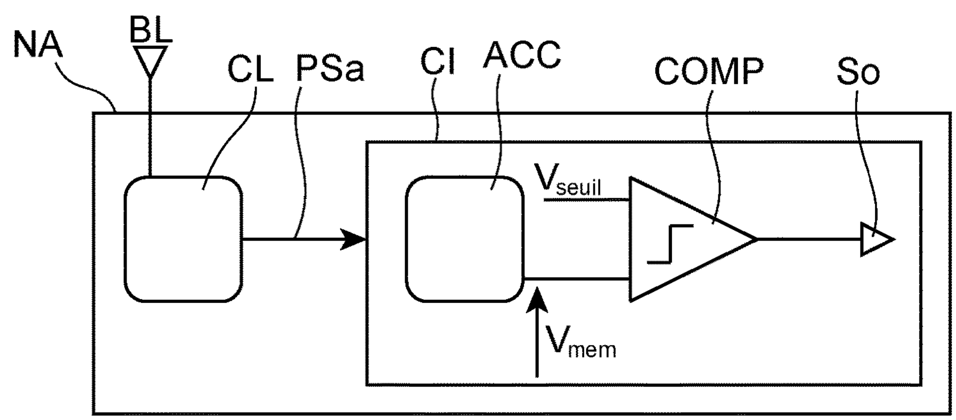
FIG. 5 is a functional diagram of an artificial neuron according to the invention.

In reference to FIG. 5, the invention relates to an artificial neuron NA for a neuromorphic chip comprising a synapse with resistive memory representative of a synaptic weight.

The synapse has a terminal for activation of the synapse and a terminal for propagation of a synaptic signal. In the presence of a presynaptic activation applied onto the activation terminal, the propagation terminal propagates a synaptic signal representative of the value of the resistive memory (i.e. the synaptic weight) in the direction of the artificial neuron NA via a bit line BL.

The artificial neuron comprises an integration circuit CI that comprises an accumulator of synaptic weights ACC at the terminals of which a membrane voltage $V_{mem}$ is established and a comparator COMP configured to emit a post-synaptic pulse SO if a threshold $V_{seuil}$ is exceeded by the membrane voltage $V_{mem}$.

The invention proposes decoupling the reading of the synaptic weight from its integration by avoiding digitising the reading of the synaptic weight. The various constraints can thus be divided up according to whether they are inherited from the technology of the resistive memory or from the operation of the analogue neuron. To do this, the invention proposes more particularly that the artificial neuron NA further include a read circuit CL configured to impose on the synapse a reading voltage independent of the membrane voltage $V_{mem}$ and to provide to the integration circuit CI an analogue value representative of the synaptic weight PSa.

The read circuit CL thus allows to impose on the synapse a reading voltage having an identical polarisation for each reading regardless of the state of the membrane voltage $V_{mem}$. This read circuit also allows to impose on the synapse a reading voltage sufficiently low to avoid any risk of parasitic writing. The result of the reading, in particular the analogue value representative of the synaptic weight PSa, is transmitted to the integration circuit. As will be seen below, this value can take various forms, such as a voltage, a current, a charge or a duration for example. The integration circuit CI, thus decoupled from the reading, can thus propose a vast range of voltage for the membrane voltage, independent of the specifications of the synapse.

Implementations of resistive synapses which can be advantageously used in the context of the invention are described in detail below. It is understood, however, that the invention is not limited to these specific implementations.

Figure 6:
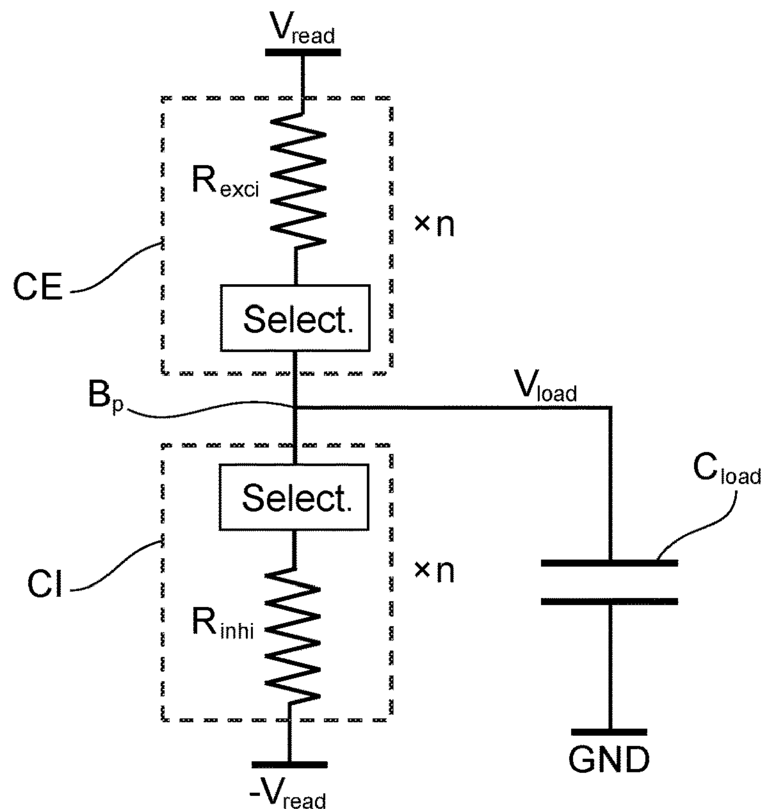
FIG. 6 illustrates an excitatory or inhibitory synapse that can be used in the context of the invention.

It can indeed be sought to have synapses which can be both excitatory and inhibitory, and which must thus be capable of both injecting and drawing current from the neuron. Since the synapses are resistive here and the current that they control depends on their resistance, two levels of voltage for supplying power to the synapse are provided, one positive and one negative. FIG. 6 provides an example of such an excitatory and inhibitory synapse, called 2R1C synapse. The synapse comprises an excitatory component CE and an inhibitory component CI arranged in series, with the propagation terminal Bp of the synapse as the midpoint, between a positive power supply voltage $V_{read}$ and a negative power supply voltage $-V_{read}$. Each of these components can consist of n≥1 1T1R or 1S1R cells according to the encoding chosen (in the drawing, the reference Select. thus designates the access transistor or the selector of such 1T1R or 1S1R cells). If multivalued RRAMs are used, it is possible that n=1. If on the contrary binary RRAMs are used, as many cells as levels of weight desired are provided. Synapses equal to −1, 0 or +1 can also be used, in which case binary RRAMs can be used and n=1. In any case, below reference is made to the total resistance of the cells in parallel by writing $R_{exci}$ and $R_{inhi}$ to respectively designate the total resistance of the excitatory component CE and the total resistance of the inhibitory component CI. In FIG. 6, the capacitance $C_{load}$ is part of the read circuit of a neuron according to a possible embodiment of the invention and is therefore shared by all the synapses of the same column.

The weight of the synapse is encoded as follows. If an excitatory synapse is desired, the resistance $R_{inhi}$ is set to its maximum level of resistance, while the resistance $R_{exci}$ ($<R_{inhi}$) modulates the positive weight of the synapse. The lower the resistance $R_{exci}$, the greater the synaptic weight, since this results in a greater synaptic current. On the contrary, if an inhibitory synapse is desired, the resistance $R_{exci}$ is set to its maximum level of resistance, while the resistance $R_{inhi}$ ($<R_{exci}$) modulates the negative weight of the synapse.

Figure 7:
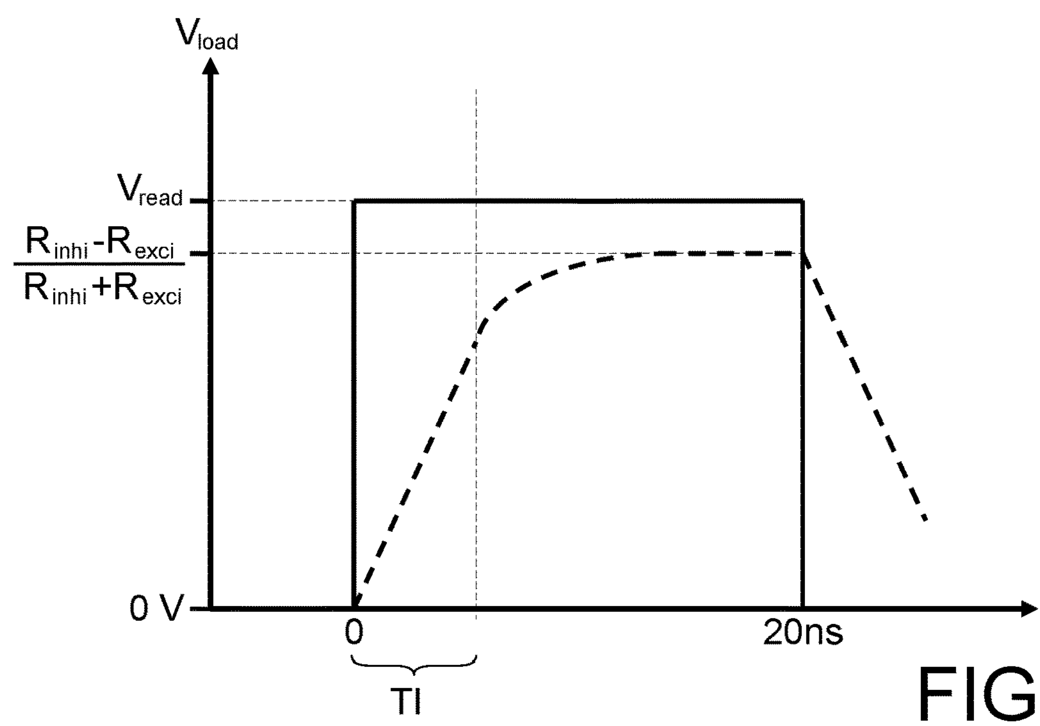
FIG. 7 shows the impulse response of the synapse of FIG. 6.

By neglecting the effects of the selectors or access transistors, the schema composed of the capacitance $C_{load}$ and of two resistances $R_{inhi}$ and $R_{exci}$ resembles a dampened resistive bridge. By applying the power supply voltages $V_{read}$ and $-V_{read}$, the potential $V_{load}$ at the propagation terminal Bp thus progressively charges as shown in FIG. 7. This FIG. 7 illustrates that the integration of the synaptic weight can only be effective over a period of integration PI corresponding to a read-pulse duration lower than the time constant of the pair $R_{syn}$-$C_{load}$. Indeed, in the contrary case, with for example $R_{exci} \ll R_{inhi}$, there is a risk of obtaining $V_{load}=V_{read}$ regardless of the value of $R_{exci}$.

This time constant is furthermore even shorter when binary RRAMs are used to obtain multivalued synapses, the placement of these binary RRAMs in parallel indeed leading to a lower overall resistance. This problem can be circumvented by using a static reading of the synapse, that is to say the reading of a value that is a function of the weight of the synapse which is stabilised in the sense that it is independent of the duration of a read pulse. FIG. 7 indeed shows that in the static state achieved with a sufficiently long read pulse, the value of $V_{load}$ can effectively be modulated by the ratio between $R_{exci}$ and $R_{inhi}$ and thus by playing with the number of high-resistance ("High Resistive State", HRS) or low-resistance ("Low Resistive State", LRS) devices in the excitatory component and inhibitory component.

Given the example of a synapse composed of 8 OxRAM devices, 4 for the excitatory component and 4 for the inhibitory component. With LRS=3 kΩ, HRS=800 kΩ and $C_{load}$=50 fF, an encoding over 9 weights (including the zero weight) associated with time constants ranging from 1 ns to 250 ps can be obtained. As for a static reading, it offers more combinations (13 weights possible) and avoids having to generate brief reading pulses. However, this static reading consumes more energy because of the "prolonged" access to the RRAM.

Figure 8:
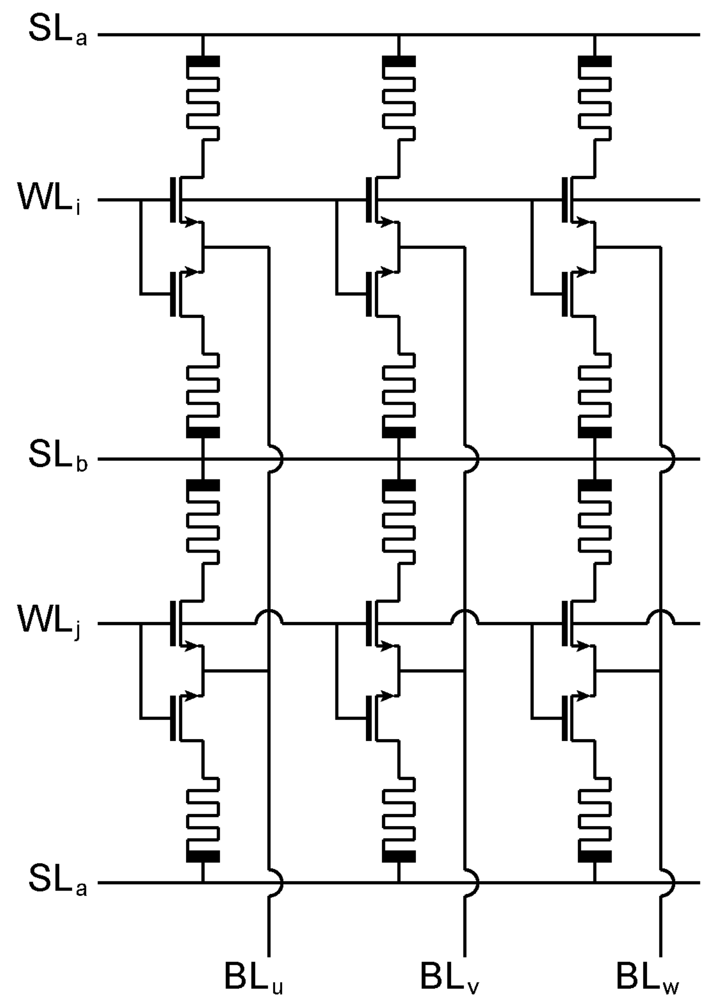
FIGS. 8 and 9 provide examples of integration of the synapse of FIG. 6 in a synaptic array.
Figure 9:
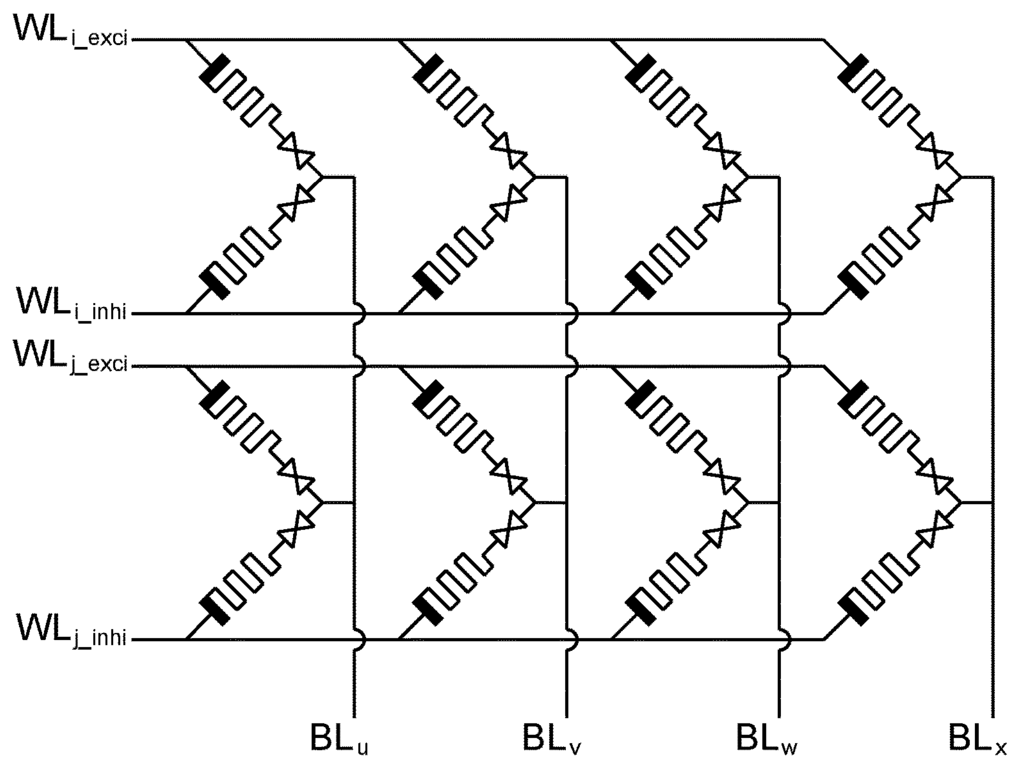

FIGS. 8 and 9 show a possible organisation of the synaptic array with 2R1C synapses corresponding to that of FIG. 6 in the case in which the components CE, CI are respectively based on 1T1R or 1S1R cells.

In the 1T1R case (FIG. 8), the excitatory and inhibitory components participating in the same synapse share their activation terminals $WL_i$, $WL_j$. Indeed, during the reading phase, the two components are read at the same time. This sharing is welcome since the synaptic array is complicated by the necessity of having two networks of distinct source lines $SL_a$, $SL_b$ which are used to distinguish the cells with shared BL and WL during the write phase and of polarising the synapses into $V_{read}$ or $-V_{read}$ according to whether they encode the excitatory or inhibitory component of their synapse during the read phase. In this configuration, the gates $SL_a$, $SL_b$ are designed to remain polarised to $\pm V_{read}$ and the write pulses between the ground and $V_{DD}$ are sent to the activation terminals $WL_i$, $WL_j$. It is noted that the access transistors of the inhibitory cells are polarised inversely.

In the 1S1R case (FIG. 9), the excitatory component of a synapse is taken between a word line $WL_{i\_exci}$, $WL_{j\_exci}$ and a bit line $Bl_u$-$Bl_x$ while the inhibitory component of the same synapse is taken between a word line $WL_{i\_inhi}$, $WL_{j\_inhi}$ and the bit line $Bl_u$-$Bl_x$. Read pulses are sent simultaneously on the word lines $WL_{i\_exci}$ and $WL_{i\_inhi}$ corresponding to a presynaptic spike relative to the line i. The word line $WL_{i\_exci}$ undergoes a pulse from the ground at $V_{read}$ and the word line $WL_{i\_inhi}$ undergoes a pulse from the ground at $-V_{read}$.

It can also be sought to implement negative spikes, in particular presynaptic pulses that invert the weight of the synapse that they trigger.

Going back to the example of FIG. 9, instead of sending positive slots on $WL_{i\_exci}$, $WL_{j\_exci}$ and negative slots on $WL_{i\_inhi}$, $WL_{j\_inhi}$, it suffices to invert these polarisations. Thus, an inhibitory synapse injects a current into $C_{load}$ and conversely an excitatory synapse removes it.

Going back to the example of FIG. 8, in the case of a negative spike it is also possible to invert the polarisation of two source lines $SL_a$, $SL_b$. This solution is not necessarily favourable, since it is long and costly in terms of energy because of the fact that these lines are shared by the entire synaptic array. Alternatively, it is possible to use a driver per source line and the polarisation of which is toggled from $V_{read}$ to $-V_{read}$ according to the sign of the presynaptic pulse to be processed. Consequently, it is no longer necessary to charge and discharge two complete arrays but only the two source lines $SL_a$ and $SL_b$ which correspond to the synapses excited by the same presynaptic pulse. In this context, it is possible to move the voltage of these source lines only during the reading and leave them grounded otherwise. Alternatively, these source lines $SL_a$ and $SL_b$ can change the polarisation (from $V_{read}$ to $-V_{read}$ and vice versa) only when this is necessary by using for this purpose a memory in each source-line driver.

Figure 10:
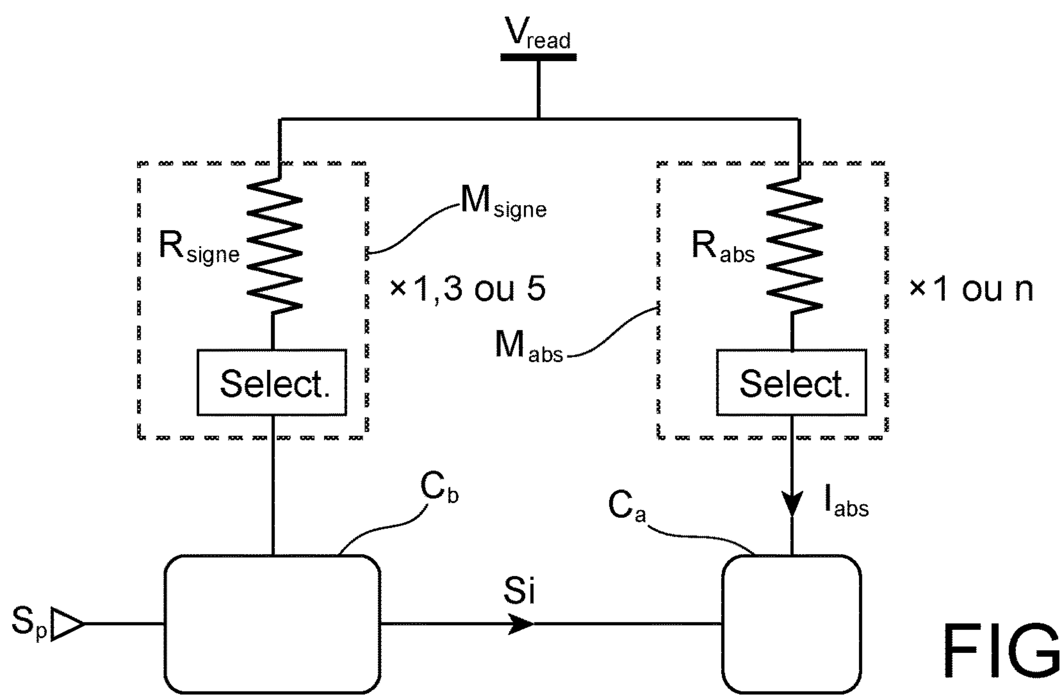
FIGS. 10 and 11 provide another example of an excitatory or inhibitory synapse that can be used in the context of the invention.
Figure 11:
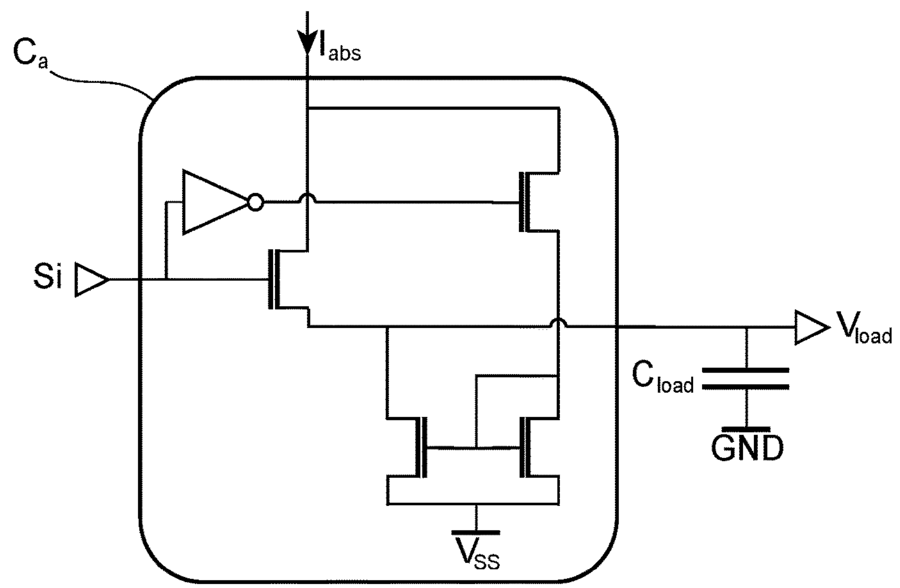

FIGS. 10 and 11 illustrate another exemplary embodiment for integrating an analogue signed weight into a synaptic array according to which an analogue absolute value is associated with a binary sign via a synapse called hereinafter absolute value+sign synapse. The synaptic array is thus more conventional, provided with a single write voltage and having unidirectional read currents. According to this example, a certain number of binary RRAMs, a multivalued RRAM or a single binary RRAM in the case of a binary synapse implement(s) the absolute value $R_{abs}$ of the synaptic weight while another RRAM, modelled by a resistance $R_{signe}$, is used binarily to encode the sign of the synaptic weight. This sign RRAM can advantageously consist of a triplet or a quintuplet of devices in which the sign of the synapse is extracted by a majority. The circuit for reading the artificial neuron thus comprises a circuit Cb for binary reading of the memory of sign of synaptic weight $M_{signe}$ and a circuit Ca for analogue reading of the memory of absolute value of synaptic weight $M_{abs}$, said analogue read circuit Ca being controlled by the binary read circuit Cb. The binary read circuit Cb uses the sign of the presynaptic spike Sp and the sign of the synaptic weight $M_{signe}$ to provide to the analogue read circuit Ca an integration sign Si indicating in which direction to integrate the analogue current $I_{abs}$ coming from the memory of absolute value of synaptic weight $M_{abs}$. Since the direction of the analogue current $I_{abs}$ is always the same, its inversion in the case of a negative integration sign can be carried out with a simple current mirror as shown in FIG. 11. In this FIG. 11, if the integration sign Si is equal to 1, the current $I_{abs}$ is injected into $C_{load}$. On the contrary, if the integration sign Si is equal to 0, the current $I_{abs}$ is removed from $C_{load}$.

Figure 12:
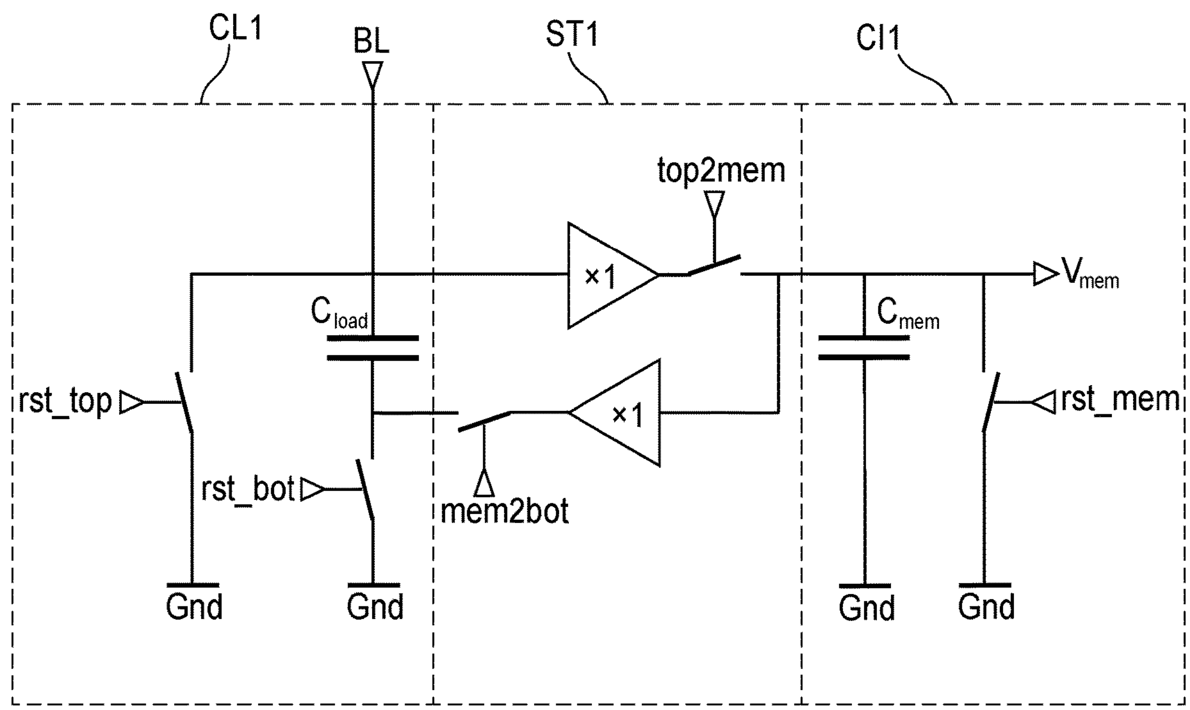
FIGS. 12 and 13 are diagrams of artificial neurons having an accumulator of synaptic current in the read circuit and an accumulator of synaptic weights in the integration circuit and for which the analogue value representative of the synaptic weight provided by the read circuit to the integration circuit is a voltage.
Figure 13:
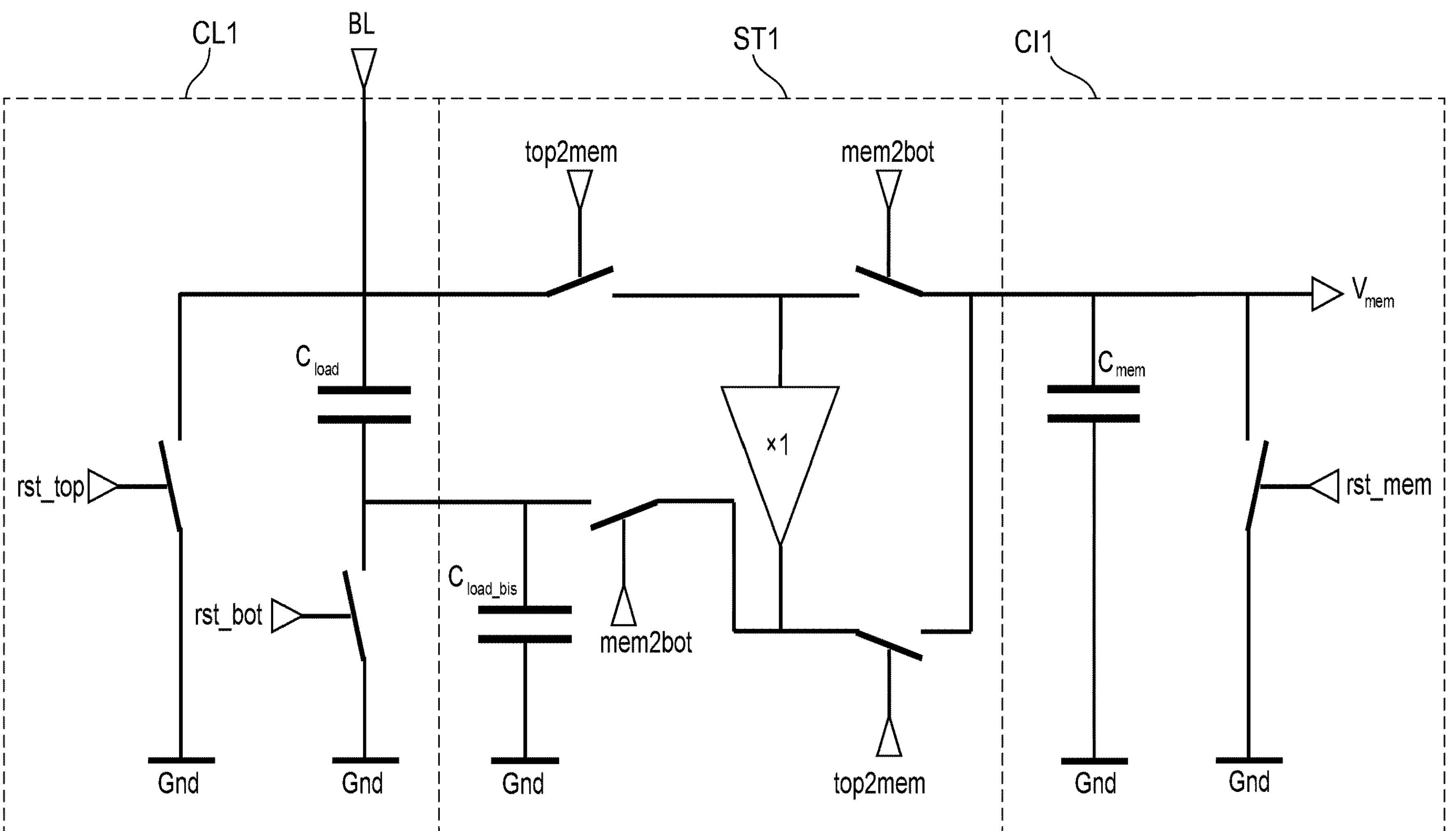
Figure 14:
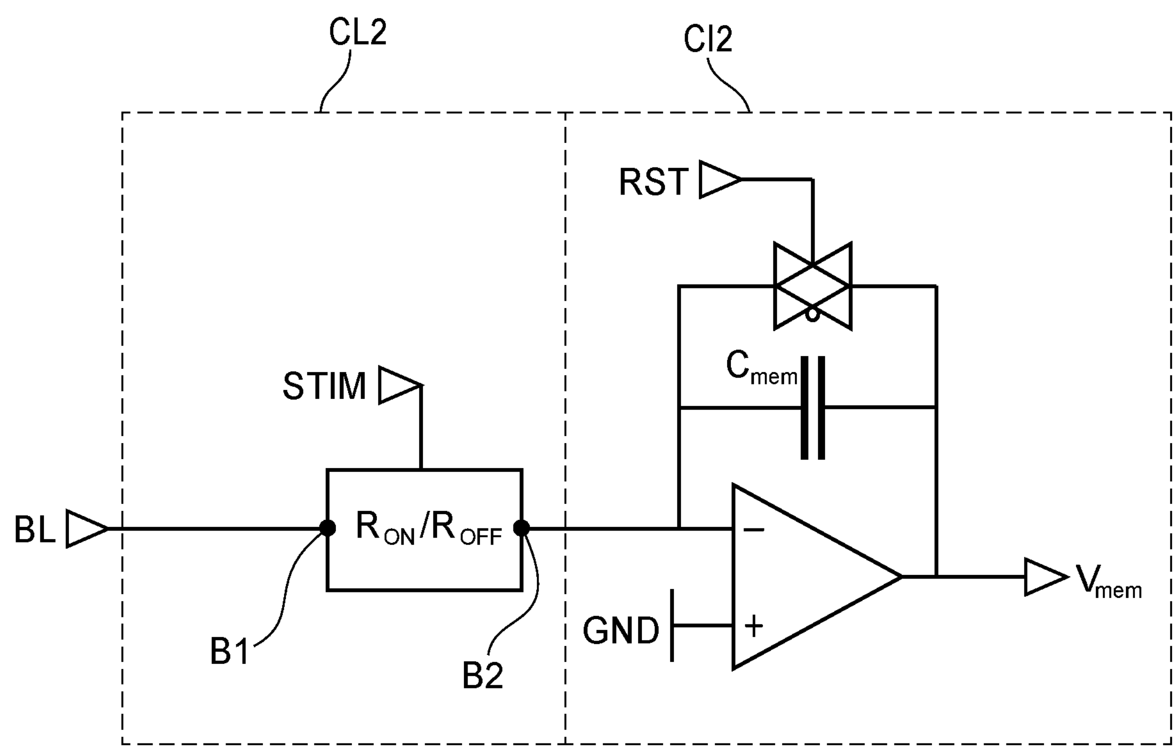
FIG. 14 shows another example of a neuron for which the analogue value is also a voltage.

FIGS. 12, 13 and 14 show exemplary embodiments of an artificial neuron for which the analogue value representative of the synaptic weight provided by the read circuit to the integration circuit is a voltage. In certain embodiments, the analogue value representative of the synaptic weight can be a voltage independent of the duration of a read pulse, the neurons carrying out a static reading of the synapse.

In FIGS. 12 and 13, the read circuit CL1 comprises an accumulator of synaptic current $C_{load}$ at the terminals of which a voltage $V_{load}$ is established, this voltage corresponding to the analogue value representative of the synaptic weight. Moreover, the artificial neuron comprises a circuit that is a bidirectional voltage tracker of ST1, ST2 interposed between the read circuit CL1 and the integration circuit CI1.

The operation of the neuron is the following. During an operation of reading the synapse, the lower pole of $C_{load}$ is connected to the virtual ground Gnd by a switch rst_bot. In a first phase of the reading operation, $C_{load}$ is first discharged by connecting its upper pole to the virtual ground using a switch rst_top, the read circuit thus being configured to discharge the accumulator of synaptic current $C_{load}$ before imposing the read voltage on the synapse. The reading of the synapse is then triggered by the opening of the switch rst_top. The current coming from the bit line BL is then accumulated in $C_{load}$, generating the read voltage $V_{load}$. The opening of rst_bot allows to obtain a floating voltage $V_{load}$. The voltage tracker ST1, ST2 is thus configured to copy the membrane voltage $V_{mem}$ at the lower terminal of $C_{load}$. Thus the voltage at the upper terminal of $C_{load}$ is equal to the sum of $V_{mem}$ and $V_{load}$. Then the voltage tracker ST1, ST2 is configured to copy this sum of voltage to the upper terminal of the membrane capacitance $C_{mem}$ thus providing the new membrane voltage that is compared to the threshold(s) for spike emission.

The analogue addition of voltage proposed in the exemplary embodiments of FIGS. 11 and 12 allows to carry out a static reading of the 2R1C synapse. Dynamic reading is also possible under the condition that a sufficiently brief read pulse is generated. Moreover, in these examples, the maximum stimulation is limited by the read voltage of the RRAMs. It can thus be chosen that such a maximum stimulation alone allows to trigger a postsynaptic spike by a neuron, the membrane voltage of which would be at its rest potential. In this case, the range of voltage of the membrane voltage $V_{mem}$ is limited by the read voltage $V_{read}$. Alternatively, such a stimulation feature is not provided, and the membrane voltage $V_{mem}$ can be spread out over a broader range of voltage.

In FIG. 12, the voltage tracker ST1 comprises two operational amplifiers, one intended via the switch mem2bot to copy the membrane voltage to the lower terminals of $C_{load}$ and the other intended via the switch top2mem to copy the sum of voltage to the upper terminals of $C_{mem}$.

In FIG. 13, the voltage tracker ST2 comprises a single operational amplifier instead of the two operational amplifiers alternatingly used in FIG. 12. In order to counteract the influence of the parasitic capacitances of the switches during the transfers of charge at the input of the operational amplifier, an additional capacitance $C_{load\_bis}$ in parallel to the switch rst_bot is provided.

It is noted that the absolute value+sign synapse is adapted to the neurons of FIGS. 12 and 13.

In FIG. 14, which also proposes an analogue value representative of the synaptic weight in the form of a voltage, the read circuit CL2 comprises a switch $R_{ON}/R_{OFF}$ having a first terminal B1 intended to be connected to the synapse via the bit line BL and a second terminal B2 connected to the integration circuit CI2. The integration circuit CI2 comprises an integrator mounting connected to the second terminal and inside of which the accumulator of synaptic weight $C_{mem}$ is mounted.

The reading of the synapse occurs as follows. First, the switch is left open (it has a resistance $R_{OFF}$ in its off state), the voltage on the bit line $V_{BL}$ is stabilised according to the weight of the synapse (therefore necessarily $R_{OFF}$>>HRS). Then, the switch is closed (it has a resistance $R_{ON}$ in its on state), the voltage $V_{BL}$ is integrated by the integrator mounting, the time constant of which depends on $R_{ON}$ and $C_{mem}$ and not on the LRS of the RRAMs. Therefore, $R_{ON}$>LRS. The neuron of FIG. 14 thus carries out a static reading of the synapse via the switch $R_{ON}/R_{OFF}$ and an integration of the voltage $V_{BL}$.

Figure 15:
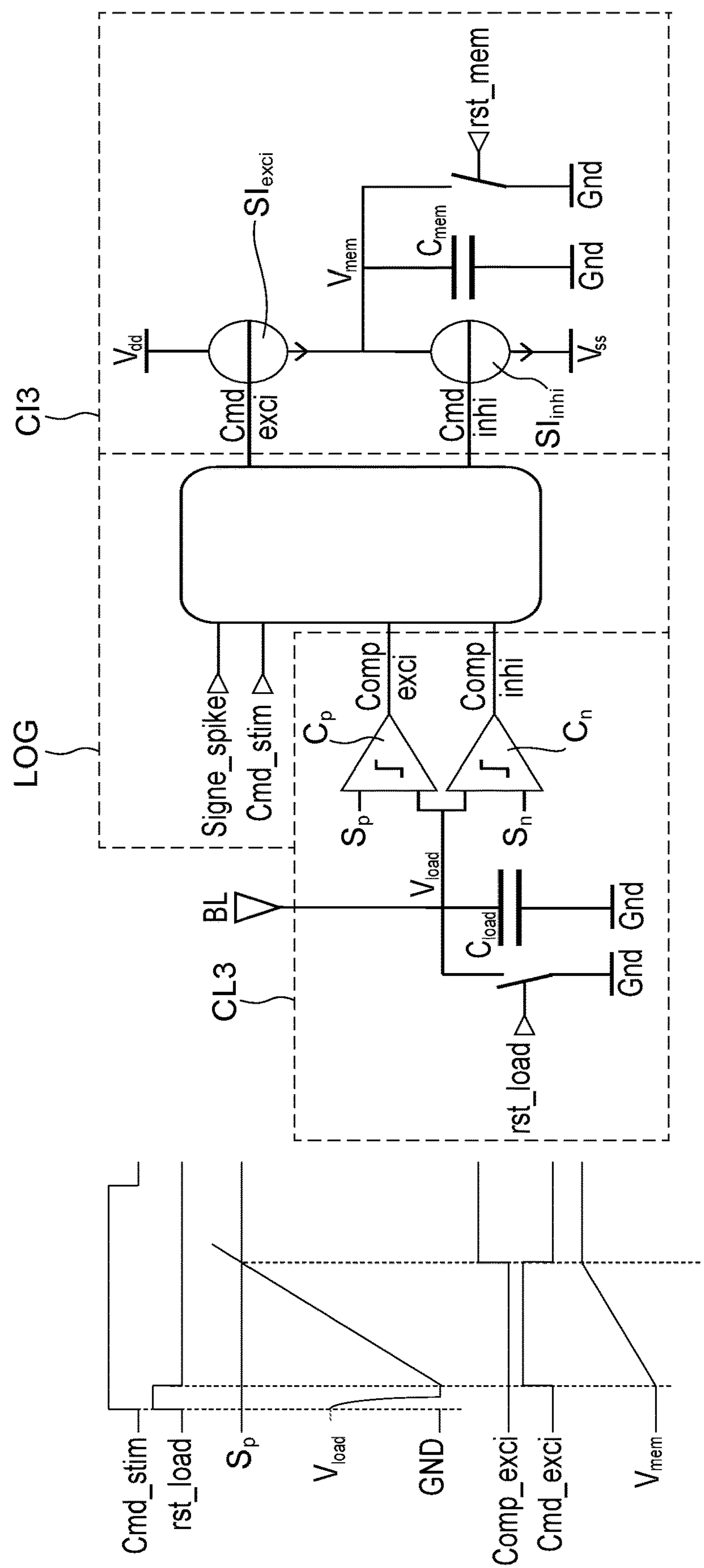
FIG. 15 shows a neuron according to the invention for which the analogue value is also a duration.
Figure 16:
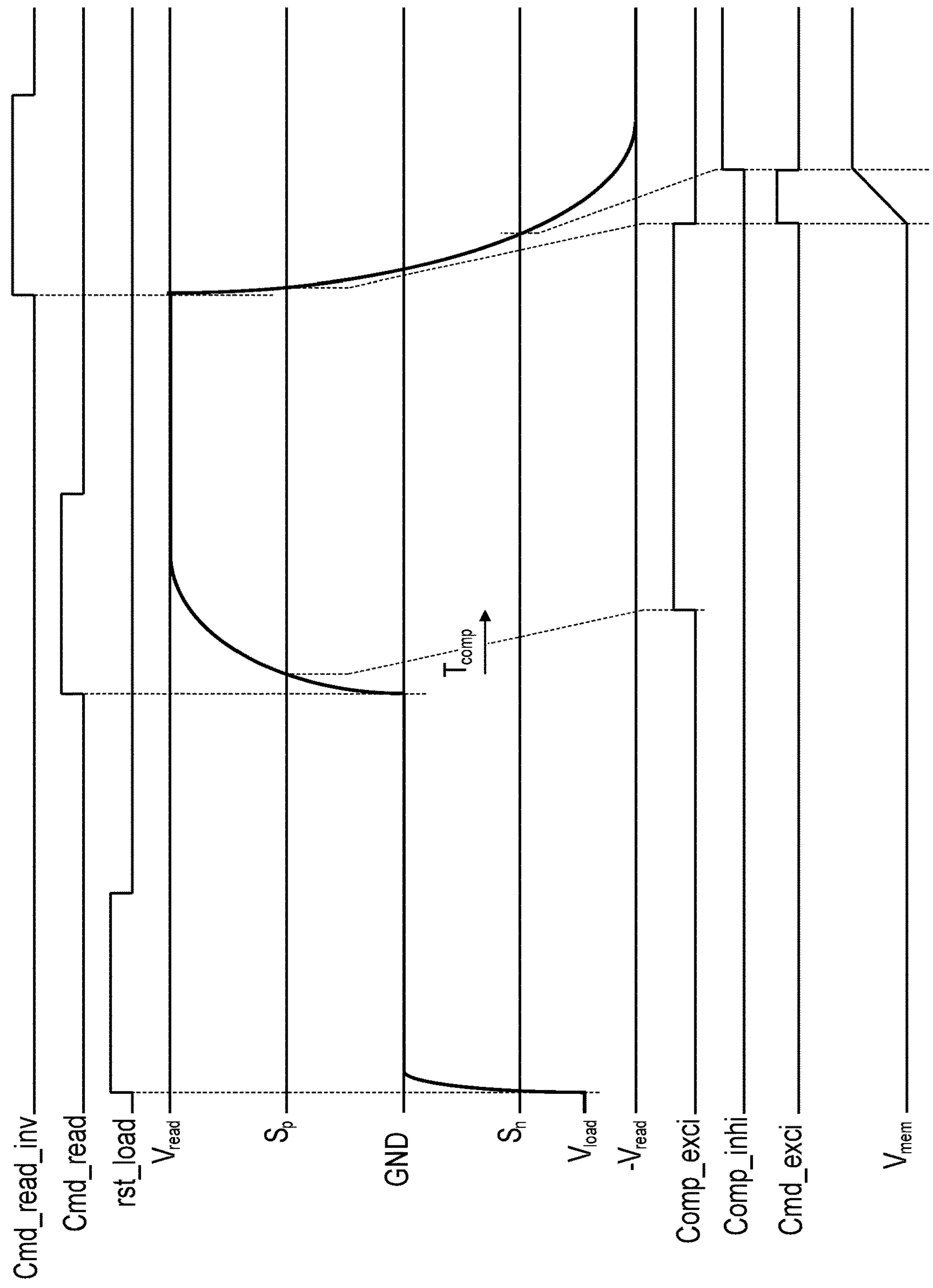
FIG. 16 illustrates another operating mode of the neuron of FIG. 15.

FIGS. 15 and 16 show exemplary embodiments of an artificial neuron according to the invention for which the analogue value representative of the synaptic weight provided by the read circuit to the integration circuit is a duration. In these examples, the neuron comprises a logic circuit LOG interposed between the read circuit CL3 and the integration circuit CI3, the logic circuit being configured to generate from said analogue value a pulse Cmd_exci, Cmd_inhi presenting said duration. As for the integration circuit CI3, it comprises a source of current $SI_{exc}$, $SI_{inhi}$ controlled by said pulse to inject a current into the accumulator of synaptic weights during said duration.

Like for the neurons of FIGS. 12 and 13, the read circuit CL3 of the neuron shown in FIG. 15 comprises an accumulator of synaptic current $C_{load}$ at the terminals of which a voltage $V_{load}$ is established and a switch rst_load allowing to carry out the discharge of this accumulator before an operation of reading the synaptic weight. During a read operation, the accumulator $C_{load}$ is charged by the synaptic current, more or less rapidly according to the synaptic weight. The duration of this charging can be estimated very simply using an analogue comparator. In FIG. 15, synapses that are both excitatory and inhibitory are considered and two comparators Cp and Cn are thus provided, tasked with comparing the voltage at the terminals of the accumulator of synaptic current $C_{load}$ respectively to a first threshold Sp (for example positive) and to a second threshold Sn (for example negative). On the timing diagrams on the left in FIG. 15, the synapse is excitatory and the voltage $V_{load}$ at the terminals of the accumulator of synaptic current $C_{load}$, after it has been discharged, progressively increases until it exceeds the first threshold Sp and switches the output Comp_exci of the comparator Cp which thus provides a piece of information on charging duration which is representative of the synaptic weight.

The output Comp_exci of the comparator Cp is provided to the logic circuit LOG interposed between the read circuit CL3 and the integration circuit CI3. This logic circuit is configured to generate, from the result of the comparison, a voltage pulse having said duration, in this case the pulse Cmd_exci in the example of FIG. 15.

As for the integration circuit CI2, it comprises a source of current $SI_{exc}$ controlled by said pulse Cmd_exci to inject a current into the accumulator of synaptic weight $C_{mem}$ during said duration. The duration of this injection of current thus depends on the value of the synaptic weight, so that the final value of the membrane voltage $V_{mem}$ also depends on the value of the synaptic weight.

In the example shown with excitatory and inhibitory synapses, the integration circuit CI2 comprises another source of current $SI_{inhi}$ controlled by a voltage pulse Cmd_inhi to draw current from the accumulator of synaptic weights $C_{mem}$ during a duration representative of the synaptic weight.

The neuron of FIG. 15 can further take into account the sign of the presynaptic pulse, said sign Signe_spike being provided to the logic circuit LOG which is thus configured to determine the integration sign from the sign of the spike and from a piece of information on sign of synaptic weight determined from that of the comparators Cp and Cn which switches. This logical and economical processing of the sign of the spike allows, in particular in the case of 1T1R cells, to lighten the synaptic array and its management. It is noted that the absolute value+sign synapse is particularly adapted to this neuron.

An advantage of this embodiment is the reliability of the zero weights. In the case of a zero weight, all the RRAM devices of the synapse are at HRS. Thus, on the one hand, the time constant associated with a synapse having a zero weight is much greater than the others and, on the other hand, Rexci≈Rinhi. It is therefore unlikely that the voltage $V_{load}$ exceed one of the two thresholds Sp, Sn not only because it will not have the time for it but also because its final value is likely to be comprised between the two thresholds. Consequently the logic circuit LOG does not see switching at the output of the comparators Cp, Cn and does not trigger any injection of charge onto $C_{mem}$. A true zero weight that in absolutely no way modifies the state of the neuron is thus implemented.

FIG. 16 shows timing diagrams illustrating another operating mode of the neuron of FIG. 15 according to which a double reading is carried out in such a way as to be insensitive to the switching delays of the comparators Cp, Cn. Indeed, according to the RRAM and transistor technologies used and the consumption of the comparators, it is possible for the switching time $T_{comp}$ of the latter to be non-negligible in comparison to the charging time of the accumulator $C_{load}$. In this case, the duration of the pulse transmitted to the integration circuit may vary little with the value of $R_{syn}$, which can turn out to be disadvantageous. In this other operating mode, the pulse is generated from two comparator switches, its duration corresponding to a duration separating the exceeding of the threshold associated with one of the comparators then the exceeding of the threshold associated with the other of the comparators. The switching delays are thus applied at the beginning and the end of the pulse and do not therefore affect its duration.

Thus, first, the synapse is read in a direction for a time sufficiently long for $V_{load}$ to be stopped on $V_{read}$ or $-V_{read}$ according to the sign of the synapse. Then, the polarisation of the reading is inverted, the voltage $V_{load}$ thus passes through the difference in potential from one polarisation of $V_{read}$ to the other and exceeds the two thresholds Sp, Sn in a time relative to the weight of the synapse. The logic circuit LOG is thus configured to generate a voltage pulse between these two switches of comparators.

Figure 17:
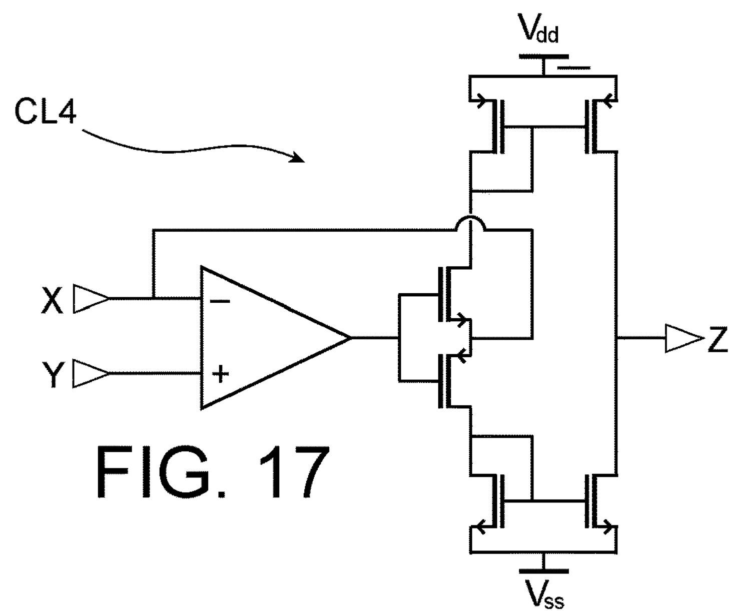
FIGS. 17, 18 and 20 show read circuits of an example of a neuron for which the analogue value is a current.
Figure 18:
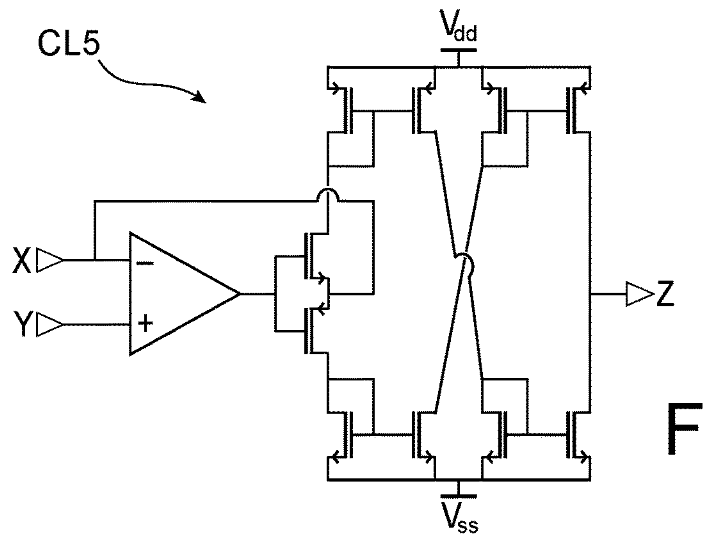

FIGS. 17 to 20 show exemplary embodiments of an artificial neuron for which the analogue value representative of the synaptic weight provided by the read circuit to the integration circuit is a current. In the example of FIGS. 17 and 18, the read circuit CL4, CL5 comprises a conveyor of current that includes an input port X intended to be connected to the synapse via the bit line, an input port Y intended to have a fixed voltage (for example the ground) imposed on it for the duration of the access to the synapse and an output port Z connected to the integration circuit.

Such a current conveyor, based on an operational amplifier and two current mirrors, is such that the fixed voltage imposed on the input port Y is copied onto the input port X and the current injected into the input port X is reproduced on the output port Z (with an inversion of sign for the circuit of FIG. 17, without inversion of sign for the circuit of FIG. 18). Since a fixed voltage is imposed on the port Y, the bit-line voltage is controlled according to this fixed voltage (it is thus independent of the membrane voltage of the neuron) and the synaptic current is delivered to the output port Z. This synaptic current is provided to the integration circuit which then carries out an analogue integration.

Figure 19:
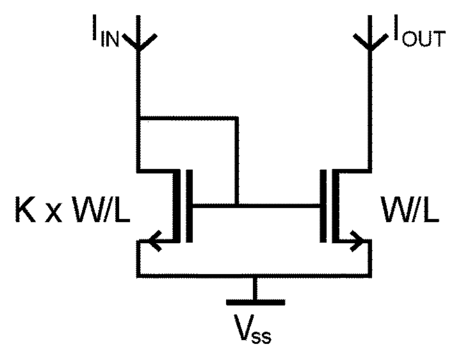
FIG. 19 illustrates an alternative embodiment of the read circuits of FIGS. 17 and 18.

The time constant $R_{syn}$-$C_{mem}$ can however turn out to be too brief for the operational amplifier and the current mirrors forming the current conveyor to function correctly. Thus, in an alternative embodiment, the current conveyor comprises, as shown in FIG. 19, a current mirror configured to carry out a lowering of the current between the input port X and the output port Z. In this figure, effectively $$I_{OUT} = \frac{-I_{IN}}{K},$$

with K a factor greater than 1 which allows to use read pulses having a longer duration and thus more adapted to the operation of the active elements without saturating the capacitance of the membrane.

Figure 20:
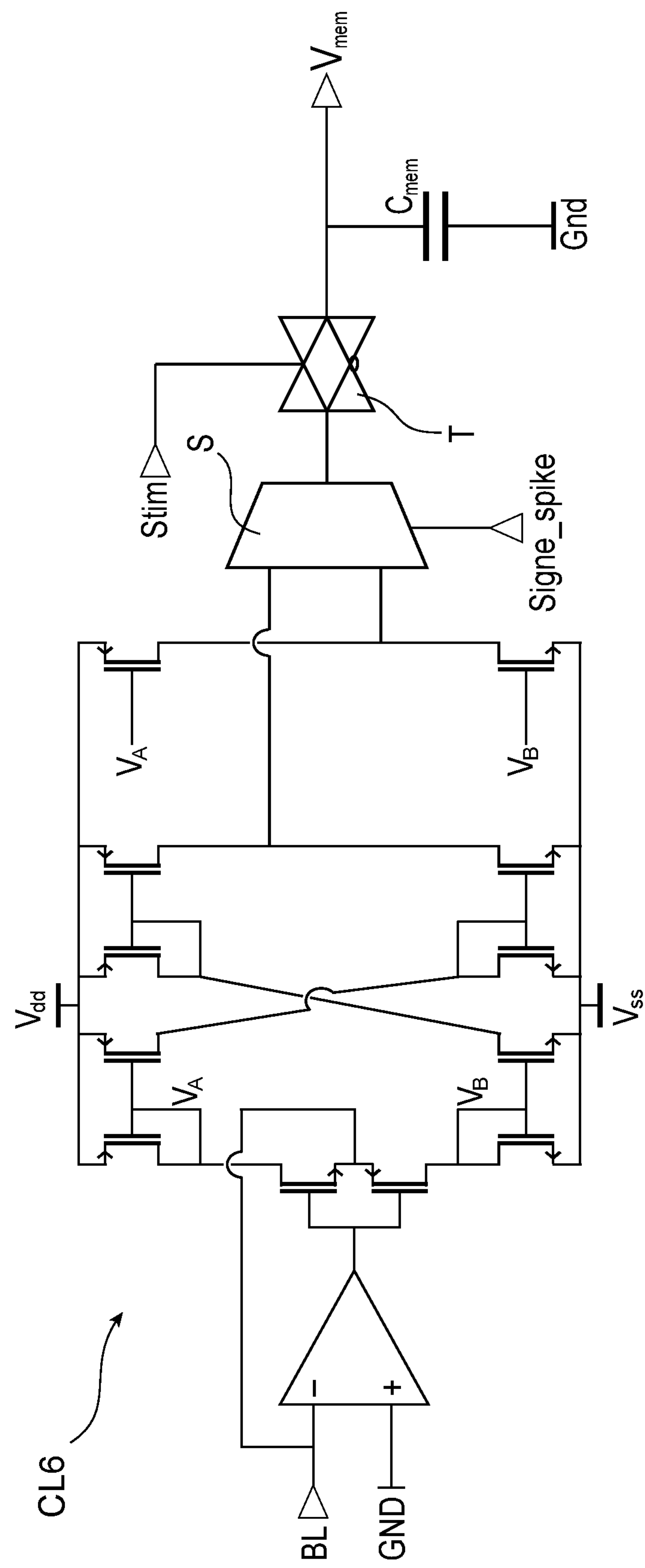

In an alternative embodiment shown in FIG. 20, the neuron comprises a transmission gate T between the read circuit and the integration circuit. This gate allows to dissociate the time of access to the RRAMs and the integration time, which allows to wait for the voltage at the input port X to stabilise before integrating the read current and to play with a brief integration pulse without this requiring a particularly reactive operational amplifier.

Moreover, in this FIG. 20 the read circuit CL6 advantageously comprises both the inverter current mirror of the read circuit CL4 and the non-inverter current mirror of the read circuit CL5 (these mirrors can carry out a lowering of the current according to FIG. 19) and a selector S controlled by a signal Signe_spike representative of the sign of the presynaptic spike to select the output of one or the other of these current mirrors.

The invention is not limited to the artificial neuron described above, and extends to a neuromorphic chip comprising a plurality of synapses with resistive memory arranged in an array of transverse lines and columns. Each synapse has a propagation terminal, the propagation terminals of the synapses of the same column being connected to each other and connected to an artificial neuron according to the invention. The synapses can be excitatory or inhibitory synapses such as those presented above in relation to FIGS. 6 to 11.

What is claimed is:

1. An artificial neuron for a neuromorphic chip comprising a synapse with resistive memory representative of a synaptic weight, the artificial neuron including:

an integration circuit that comprises a synaptic weights accumulator at terminals of which a membrane voltage is established;

a comparator configured to emit a postsynaptic pulse if a threshold is exceeded by the membrane voltage;

a read circuit configured to impose on the synapse a read voltage independent of the membrane voltage and to provide an analogue value representative of the synaptic weight, said analogue value being a duration; and a logic circuit interposed between the read circuit and the integration circuit, the logic circuit being configured to generate from said analogue value a duration representative pulse having said duration, wherein the integration circuit comprises a source of current controlled by said duration representative pulse to inject a current into the synaptic weights accumulator during said duration.

2. The artificial neuron according to claim 1, wherein the read circuit comprises a synaptic current accumulator, at least one comparator that compares a voltage at terminals of the synaptic current accumulator to a threshold to provide a comparison result and wherein the logic circuit is configured to generate said duration representative pulse from the comparison result.

3. The artificial neuron according to claim 1, wherein the at least one comparator of the read circuit comprises a first comparator to a first threshold and a second comparator to a second threshold and wherein the logic circuit is configured to determine an integration sign by using a signal representative of a sign of a presynaptic pulse and a piece of information relative to a synaptic weight sign determined by that of the first and second comparators that provides a positive comparison result.

4. The artificial neuron according to claim 1, wherein the at least one comparator of the read circuit comprises a first comparator to a first threshold and a second comparator to a second threshold and the logic circuit is configured in such a way that the duration of said duration representative pulse corresponds to a duration separating the exceeding of one of the first threshold and second thresholds and then the exceeding of the other of the first threshold and second thresholds.

5. The artificial neuron according claim 1, wherein, the synapse comprising a memory synaptic weight absolute value and a memory of synaptic weight sign, the read circuit comprises a circuit for binary reading the memory of synaptic weight sign and a circuit for analogue reading the memory of synaptic weight absolute value controlled by the circuit for binary reading.

6. A neuromorphic chip comprising a plurality of synapses with resistive memory arranged in an array of transverse lines and columns, each synapse having a terminal for propagation of a synaptic signal, the propagation terminals of the synapses of the same column being connected to each other and connected to an artificial neuron according to claim 1.

7. The neuromorphic chip according to claim 6, wherein each synapse comprises an excitatory component and an inhibitory component connected in series by the propagation terminal of the synapse.

* * * * *